United States Patent [19]

Berger et al.

[11] Patent Number: 4,677,047

[45] Date of Patent: * Jun. 30, 1987

[54] COMPOSITIONS OF MATTER WHICH CROSSLINK UNDER THE ACTION OF LIGHT IN THE PRESENCE OF SENSITIZERS

[75] Inventors: Joseph Berger, Basel; Friedrich Lohse, Oberwil, both of Switzerland

[73] Assignee: Ciba-Geigy Corporation, Ardsley, N.Y.

[*] Notice: The portion of the term of this patent subsequent to Oct. 7, 2003 has been disclaimed.

[21] Appl. No.: 779,184

[22] Filed: Sep. 23, 1985

Related U.S. Application Data

[63] Continuation of Ser. No. 545,417, Oct. 25, 1983, abandoned.

[30] Foreign Application Priority Data

Nov. 4, 1982 [CH] Switzerland .......................... 6416/82

[51] Int. Cl.[4] .............................................. G03C 1/70
[52] U.S. Cl. .................................. 430/283; 430/286; 430/287; 430/922; 430/907; 430/927; 522/53; 522/117; 525/282
[58] Field of Search ............... 430/283, 286, 287, 922, 430/927, 907; 522/53, 117; 525/282

[56] References Cited

U.S. PATENT DOCUMENTS

| | | | |
|---|---|---|---|
| 2,965,553 | 12/1960 | Dixon et al. | 522/117 |
| 3,622,321 | 11/1969 | Heverlee | 430/283 |
| 4,216,297 | 8/1980 | Vaughan et al. | 525/282 |
| 4,266,005 | 5/1981 | Nakamura et al. | 430/271 |
| 4,269,680 | 5/1981 | Rowe et al. | 204/159.17 |
| 4,283,509 | 8/1981 | Zweifel et al. | 430/287 |
| 4,394,435 | 7/1983 | Farber et al. | 430/287 |
| 4,430,417 | 2/1984 | Heinz et al. | 430/286 |

FOREIGN PATENT DOCUMENTS

106981  8/1981  Japan ............................. 204/159.15

OTHER PUBLICATIONS

T. F. Saunders et al., "Photosensitive Polyimide Coatings", *IBM Technical Disclosure Bulletin*, vol. 16, No. 2, Jul. 1973, pp. 601-602.

Jaromir Kosar, *Light-Sensitive Systems: Chemistry and Application of Nonsilver Halide Photographic Processes*, John Wiley & Sons, Inc., New York, N.Y. 1965, pp. 170-172.

G. E. Green and S. A. Zahir, "Photocross-Linkable & Resin Systems", *Journal of Macromolecular Sciences, Science, Reviews in Macromolecular Chemistry* 1981-1982, C21 (2), pp. 187-273.

*Primary Examiner*—John E. Kittle
*Assistant Examiner*—Cynthia Hamilton
*Attorney, Agent, or Firm*—Luther A. R. Hall

[57] ABSTRACT

Novel compositions of matter which crosslink under the action of light and which contain (A) an aliphatically unsaturated polymerization product which is free of aromatic groups and which can contain structural elements of the formula I

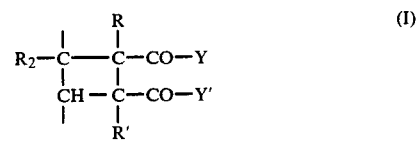

(B) a bisimide of the formula II

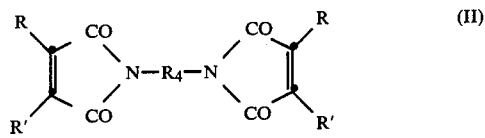

and a sensitizer and, if desired, a further crosslinking agent, where R and R' are alkyl or together are tetramethylene, $R_1$ is hydrogen, chlorine or methyl, Y and Y' are each —OH or together are —O— and $R_4$ is alkylene, arylene or bis-arylene, are suitable, inter alia, for preparing printing plates or as photoresist materials.

8 Claims, No Drawings

COMPOSITIONS OF MATTER WHICH CROSSLINK UNDER THE ACTION OF LIGHT IN THE PRESENCE OF SENSITIZERS

This is a continuation of application Ser. No. 545,417, filed Oct. 25, 1983, now abandoned.

The present invention relates to novel compositions of matter which crosslink under the action of light in the presence of sensitisers, and to their use.

It is known that polymers with C=C double bonds can crosslink under the action of light in the presence of sensitisers and/or crosslinking agents, for example mixtures of diene (co)polymers and Michler's ketone, thioxanthones or anthraquinone and/or bisimides or azides and, if desired, further additives and can be used, for example, as photoresists (cf., for example, U.S. Pat. Nos. 3,169,868 and 3,622,321 and German Offenlegungsschrift 3,014,261). If at least partially unsaturated diene or olefine (co)polymers are reacted with unsaturated carboxylic anhydrides, such as maleic anhydrides, under free-radical conditions in the presence of initiators or photochemically in the presence of sensitisers, addition (graft) and crosslinking reactions will take place at the same time (cf. for example Japanese Laid-Open Applications Nos. 52-96,694 and 55-98,204).

The invention provides novel compositions of matter which crosslink under the action of light in the presence of sensitisers and which contain (A) an aliphatically unsaturated polymerisation product which is free of aromatic groups and which can contain structural elements of the formula I

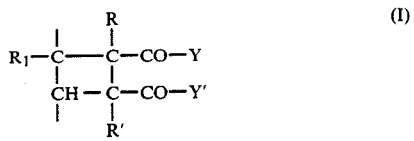

and
(B) a bisimide of the formula II

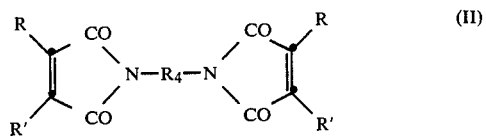

in which R and R', independently of each other, are each $C_{1-4}$-alkyl or together tetramethylene which is unsubstituted or substituted by a methyl group, or a grouping of the formula III

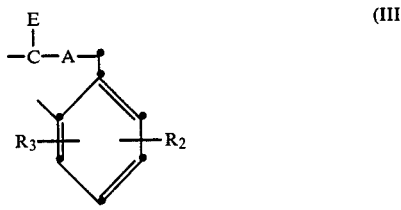

$R_1$ is hydrogen, chlorine or methyl, $R_2$ and $R_3$, independently of each other, are each hydrogen, halogen, $C_{1-4}$-alkyl or methoxy, A is $-CH_2-$, $-CH_2CH_2-$ or $-OCH_2-$ with oxygen bonded to the aromatic ring, and E is hydrogen, or A is $-O-$ and E is $-CH_3$, $R_4$ is $-C_mH_{2m}-$ with m=1 to 20, $-(CH_2)_xQ(CH_2)_x-$, $-(CH_2)_2NH(CH_2)_2NH(CH_2)_2-$, $-CH_2-Z-CH_2-$, phenylene which can be substituted by 1 or 2 chlorine atoms or 1 or 2 methyl groups, naphthalene or a group of the formula

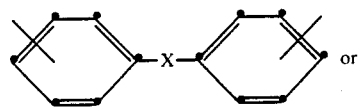

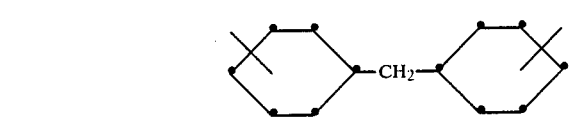

Q is $-S-$, $-O-$ or in particular $-NH-$, x and x', independently of each other, are each a number from 2 to 4, preferably 2, Z is phenylene or $C_{4-6}$-cycloalkylene, X is a direct bond, $-O-$, $-S-$, $-SO_2-$, $-CH_2-$ or $-C(CH_3)_2-$, and Y and Y' are each $-OH$ or together $-O-$, and the proportion of bisimide of the formula II is 0.1 to 75% by weight, preferably 1 to 25% by weight, based on polymer (A).

R, R', $R_2$ and $R_3$ alkyl groups can be straight-chain or branched. Examples of such groups are methyl, ethyl, n-propyl, isopropyl, n-butyl and sec.-butyl. A preferred alkyl group has 1 or 2 carbon atoms and is in particular methyl.

If R and R' together are a grouping of the formula III, E, $R_2$ and $R_3$ preferably are each hydrogen, and A is $-CH_2-$. R and R' together are preferably tetramethylene, 3- or 4-methyl tetramethylene or especially are each methyl.

An $R_4-C_mH_{2m}-$ can be a straight-chain or branched radical, for example, methylene, ethylene, 1,2- and 1,3-propylene, tetramethylene, 1,1,3,3-tetramethylbutylene, pentamethylene, hexamethylene, heptamethylene, octamethylene, nonamethylene, decamethylene, undecamethylene, tridecamethylene, tetradecamethylene, hexadecamethylene, heptadecamethylene, octadecamethylene or eicosylene. Preferred $-C_mH_{2m}-$ radicals are straight-chain with m=2-10. An $R_4-CH_2-Z-CH_2$ group can be, for example, a 1,3- or 1,4-phenylene group or a 1,2-cyclobutylene, 1,3-cyclopentylene or 1,3-cyclohexylene group. Z is preferably 1,3- or 1,4-phenylene or 1,3- or 1,4-cyclohexylene.

A phenylene $R_4$ which can be substituted by 1 or 2 chlorine atoms or 1 or 2 methyl groups can be, for example, the 1,3- or 1,4-phenylene, o- or m-toluylene, 4,5-dimethyl-1,2-phenylene or 3-chloro-1,4-phenylene group. An $R_4$ group of the formula

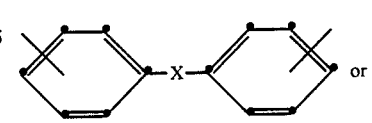

is in particular the radical of 4,4'-diaminodicyclohexylmethane, 4,4'-diaminodiphenylmethane, 4,4'-diaminodiphenyl ether or 4,4'-diaminodiphenyl sulfide. $R_4$ is preferably straight-chain $-C_mH_{2m}-$ with m=2-10, $-(CH_2)_2Q(CH_2)_2-$ with Q=$-S-$, $-O-$ or in particular —NH—, —CH$_2$—Z—CH$_2$— with Z=1,3- or 1,4-phenylene, 1,3- or 1,4-cyclohexylene, the radical of 4,4'-diaminodiphenylmethane, 4,4'-diaminodiphenyl ether or 4,4'-diaminodiphenyl sulfide, or 1,3- or 1,4-phenylene.

Y and Y' preferably are together —O—.

In very particularly preferred compositions of matter, R and R' are each methyl, Y and Y' together are —O—, and R$_4$ is —(CH$_2$)$_2$NH(CH$_2$)$_2$— or especially straight-chain —C$_m$H$_{2m}$— with m=2–10.

The polymers to be used according to the invention preferably have an average molecular weight of 1,000 to 1,000,000 and very particularly of 1,000 to 350,000. The average molecular weight of the polymers can be determined by methods known per se, for example by means of light-scattering, vapour pressure osmometry or ultracentrifugation.

Examples of suitable polymers are polymers which are obtained by homopolymerising or copolymerising dienes, for example butadiene, isoprene, chloroprene or mixtures thereof, if desired in the presence of other ethylenically unsaturated monomers which are free of aromatic groups. Examples of such monomers are acrylic acid, methacrylic acid, acrylic acid and methacrylic acid esters, acrylonitrile, vinyl acetate and its hydrolysis products, vinyl chloride, vinylidene chloride, vinylidene fluoride and maleic anhydride.

Polymers which are preferably used consists of recurring structural elements of the formulae IV or V

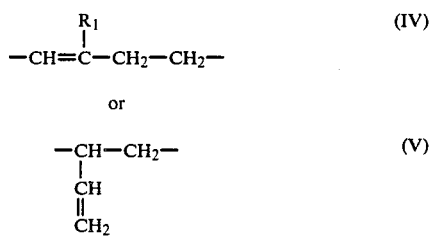

in which R$_1$ is as defined under the formula I. 1,2-polybutadiene and especially 1,4-polybutadiene are particularly preferred.

Polymers which have structural elements of the formula I can be obtained by reacting aliphatically unsaturated polymers which are free of aromatic groups with a compound of the formula VI

under free-radical conditions or under the action of light, and if desired hydrolysing the anhydride groups, R and R' being as defined under the formula I. The reaction is advantageously carried out in an inert gas atmosphere, for example under nitrogen, and in the presence of an inert organic solvent and of a sensitiser of the type described below. Examples of suitable solvents are aliphatic, cycloaliphatic or aromatic hydrocarbons, which can be halogenated, such as pentane, hexane, heptane, cyclohexane, benzene, toluene, chlorobenzene, or dichlorobenzenes, cyclic or aliphatic amides, such as N-methylpyrrolidone, N-ethyl-2-pyrrolidone, N-methyl-ε-caprolactam, N,N-dimethylformamide, N,N-dimethylacetamide and N,N-diethylacetamide, aliphatic and cyclic ketones, such as acetone, methyl ethyl ketone, cyclohexanone and cyclopentanone, and alcohols, such as methanol, ethanol, and 2-methoxyethanol. It is also possible to use mixtures of said solvents. Preferred solvents are aromatic hydrocarbons which can be unsubstituted or substituted by halogen, in particular benzene, toluene and chlorobenzene or mixtures thereof.

The compounds of the formulae IV, V and VI are known or can be prepared by methods known per se. Compounds of the formula II can be obtained in a manner known per se by reacting a compound of the formula VI with H$_2$N—R$_4$—NH$_2$ diamines and cyclising the amide acids formed as intermediates.

The compositions of matter according to the invention can contain, in addition to the sensitisers, further customary additives, such as further crosslinking agents. Possible additional crosslinking agents are in particular diamines, for example those of the type described in German Offenlegungsschrift No. 2,657,104. Suitable sensitisers are in particular triplet sensitisers on whose application the reaction takes place by triplet energy transfer from the excited sensitiser to the groundstate compounds of the formula II, for example ketones, for example acetophenone, benzophenone, acetone, methyl ethyl ketone, methyl isobutyl ketone, Michler's ketone, 1,2-dibenzilbenzene, 1,4-diacetylbenzene, 4-cyanobenzophenone, thioxanthone, anthraquinone, 1,2- and 1,4-naphthoquinone, 2-methylanthraquinone, benzanthrone, violanthrone, p,p'-tetramethyldiaminobenzophenone, or chloroanil, anthracene, chrysene, or nitro compounds, such as nitrobenzene, p-dinitrobenzene, 1- or 2-nitronaphthalene, 2-nitrofluorene, 5-nitroacenaphthene, nitroaniline, 2-chloro-4-nitroaniline or 2,6-dichloro-4-nitroaniline. The sensitisers used can also be free-radical initiators, such as azoisobutyronitrile, or peroxides, for example dibenzoyl peroxide. The sensitisers which are preferably used are unsubstituted thioxanthones or substituted thioxanthones, for example those of the type described in German Offenlegungsschrift Nos. 3,018,891 and 3,117,568 and European Patent Application Publication No. 33,720.

The invention also relates to the crosslinked products which can be obtained by crosslinking a composition of matter of the type defined under the action of light in the presence of a sensitiser and in the presence or absence of a further crosslinking agent. Examples of possible sensitisers are those of the abovementioned type.

UV light is preferably used for irradiating the crosslinking reactions as well as the possible preceding reaction of the polymers with the anhydrides of the formula VI. Examples of suitable light sources are xenon lamps, carbon arcs, mercury lamps and metal halide/mercury lamps.

The compositions of matter according to the invention are suitable, for example, for preparing coatings on various substrates, for example metals, such as aluminium, copper and steel, or plastics, for example polyesters, cellulose acetate and the like, or for preparing offset printing plates, for preparing photooffsetresists, or for unconventional photography, for example for preparing, by means of photocrosslinking, photographic images. They are preferably used for preparing printing plates or as photoresist materials for manufacturing printed circuits by methods known per se. In the latter application, that face of the conductor board which has been provided with the light-sensitive layer is exposed through a photomask incorporating the circuit diagram and is then developed, whereupon the unexposed areas of the layer are removed by means of developing liquid. The support materials can be coated with light-sensitive compositions of matter by techniques which are customary per se, for example by dipping, spraying, whirler-coating, cascade-coating, knife-coating, curtain-coating or roller-coating.

The compositions of matter according to the invention are distinguished in particular by their high degree of light-sensitivity. The crosslinked products which can be obtained therefrom, preferably in the form of coatings, have good photographic resolving power, high resilience and excellent adhesion to various substrates, for example those of the abovementioned type. Coatings which are obtained from a bisimide of the formula II and a polymer having structural elements of the formula I are additionally distinguished by an increased hydrophilic character, i.e. the unexposed areas of the coataing can also be washed out with aqueous or aqueous-alkaline developer solutions, which can be an ecological advantage over certain organic developing baths. Coatings of this type can also be coloured with cationic dyes.

EXAMPLES 1-5

0.25 g of polybutadiene (36% of cis-1,4, 54% of trans-1,4 and 10% of 1,2-vinyl; average molecular weight $M_w=0.23\times10^6$; $M_w/M_n=1.9$) are dissolved in each case in 7.19 g of toluene together with an amount of N,N'-octamethylene bis-dimethylmaleinimide as specified in Table I, below, and 18 mg of thioxanthone. The solutions obtained are coated onto copper conductor boards by means of a 50 μm doctor and are dried at 100° C. in the course of 3 minutes. The coating is then exposed through a photographic mask incorporating a step wedge (21 step sensitivity guide from Stouffer) to the light of a 5,000-W high pressure burner a distance of 70 cm away and is developed in toluene in the course of 1 minute.

TABLE I

| Example No. | % by weight of imide[1] | Ratio of polymer to imide double bonds[2] | Duration of exposure to light (seconds) | Final step depicted |
|---|---|---|---|---|
| 1 | 50 | 6.7 | 10 | 8 |
|   |    |     | 30 | 13 |
| 2 | 25 | 13.2 | 10 | 11 |
|   |    |      | 30 | 14 |
| 3 | 11 | 29.8 | 10 | 12 |
|   |    |      | 30 | 14 |
| 4 | 5  | 64.1 | 10 | 10 |
|   |    |      | 30 | 13 |
| 5 | 2.5 | 130.0 | 10 | 8 |
|   |     |       | 30 | 12 |

[1]based on the weight of the starting polymer
[2]ratio of double bonds in the unsaturated starting polymer to the bisimide.

EXAMPLE 6

5.0 g of polybutadiene having terminal OH groups ($\overline{M}_w=2,800$; 64% of 1,4-trans, 20% of 1,4-cis and 20% of vinyl) are dissolved in 57 g of toluene. The solution is introduced into a flask which has been equipped with a dropping funnel, a refluxing condenser, a nitrogen-inlet and -outlet, a magnetic stirrer and a 125-W HPK Philips high pressure burner, and is then flushed with nitrogen for 15 minutes. A solution of 0.51 g of dimethylmaleicanhydride and 0.25 g of thioxanthone in 70 g of toluene is added dropwise in the course of 150 minutes as the content of the flask is exposed to light. The reaction vessel is irradiated for a further 16 hours, whereupon the polymer obtained is precipitated in a 20-fold excess of diethyl ether. The polymer is then dried at 20° C. in vacuo. Yield: 5.3 g. Tg= −56° C. Elemental analysis: found C 73.52%, H 10.41%. $\eta_{red.}=0.08$ dl/g (0.5% solution in m-cresol at 25° C.). Total acid content: 0.72 mEq/g (corresponds to an approximately 4% filling of the C=C double bonds of the polymer).

5.0 g of the polyer thus obtained, 50 mg of N,N'-hexamethylene-bis-dimethylmaleinimide and 27.5 mg of ethyl 7-methylthioxanthone-3-carboxylate are dissolved in 11 g of chloroform. The solution is applied to a copper conductor board by means of a 50 μm doctor and is dried at 80° C. in the course of 3 minutes. The coating is then exposed for 2 minutes through a photographic mask of the type described in Examples 1-5 to the light of a 5,000-W high pressure burner a distance of 70 cm away. The unexposed parts of the coating are then washed out in 5% NaOH in the course of 5 minutes. Final step depicted on the step wedge: 8.

What is claimed is:

1. A composition of matter, which crosslinks under the action of light in the presence of sensitizers, which comprises
   (A) an aliphatically unsaturated polymerization product which is free of aromatic groups,
   (B) a bisimide of the formula

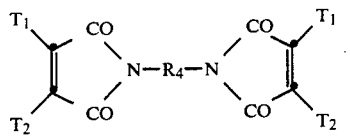

in which $T_1$ and $T_2$ together are a grouping of the formula

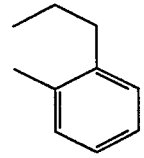

$R_4$ is —$C_mH_{2m}$— with m=1 to 20, —$(CH_2)_xQ(CH_2)_{x'}$—, —$(CH_2)_2NH(CH_2)_2NH(CH_2)_2$—, —$CH_2$—Z—$CH_2$—, phenylene which can be substituted by 1 or 2 chlorine atoms or 1 or 2 methyl groups, naphthalene or a group of the formula

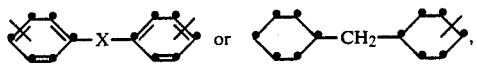

Q is —S—, —O— or —NH—, x and x', independently of each other, are each a number from 2 to 4, Z is phenylene or $C_{4-6}$-cycloalkylene, X is a direct bond, —O—, —S—, —$SO_2$—, —$CH_2$— or $C(CH_3)_2$—, with the proportion of the bisimide of component (B) being 0.1 to 75% by weight, based on polymer (A), and
   (C) a photosensitizer.

2. A composition according to claim 1 which additionally contains structural elements of the formula I

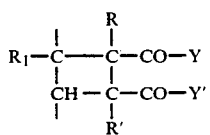

wherein R and R' in said formula I are independently of each other $C_1$-$C_4$-alkyl, or together tetramethylene which is unsubstituted or substituted by a methyl group, $R_1$ is hydrogen, chlorine or methyl, and Y and Y' are each —OH or together are —O—.

3. A composition of matter according to claim 1, wherein the proportion of bisimide of component (B) is 1 to 25% by weight, based on polymer (A).

4. A composition of matter according to claim 1, wherein $R_4$ is straight-chain —$C_mH_{2m}$— with m=2-10, —$(CH_2)_2Q(CH_2)_2$— with Q=—S—, —O— or —NH—, —$CH_2$—Z—$CH_2$— with Z=1,3- or 1,4-phenylene or 1,3- or 1,4-cyclohexylene, the radical of 4,4'-diaminodiphenylmethane, 4,4'-diaminodiphenyl ether or 4,4'-diaminodiphenyl sulfide, or 1,3- or 1,4-phenylene.

5. A composition of matter according to claim 1, wherein the polymer consists of recurring structural elements of the formula IV or V

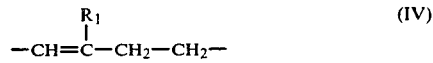

or

in which $R_1$ is hydrogen, chlorine or methyl.

6. A composition of matter according to claim 1, wherein the polymer is a 1,2- or a 1,4-polybutadiene.

7. A composition of matter according to claim 1, wherein the sensitiser is an unsubstituted or substituted thioxanthone.

8. A coated material which contains a light-sensitive layer according to claim 1 on a substrate.

* * * * *